(12) United States Patent
Kurahashi et al.

(10) Patent No.: US 7,166,865 B2
(45) Date of Patent: Jan. 23, 2007

(54) SEMICONDUCTOR LIGHT EMITTING DEVICE AND METHOD FOR MANUFACTURING SAME

(75) Inventors: Takahisa Kurahashi, Kashiba (JP); Tetsurou Murakami, Tenri (JP); Shouichi Ohyama, Souraku-gun (JP); Hiroshi Nakatsu, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 113 days.

(21) Appl. No.: 10/957,614

(22) Filed: Oct. 5, 2004

(65) Prior Publication Data

US 2005/0093015 A1 May 5, 2005

(30) Foreign Application Priority Data

Oct. 31, 2003 (JP) ............................. 2003-371846

(51) Int. Cl.
*H01L 29/15* (2006.01)
(52) U.S. Cl. ..................... 257/76; 257/13; 257/85; 257/94; 257/198; 257/E33.001; 438/22; 438/24
(58) Field of Classification Search ................ None
See application file for complete search history.

(56) References Cited

U.S. PATENT DOCUMENTS 5,502,316 A 3/1996 Kish et al.

2004/0104395 A1* 6/2004 Hagimoto et al. ........... 257/79

FOREIGN PATENT DOCUMENTS

| JP | A-6-302857 | 10/1994 |
| JP | A-2001-144322 | 5/2001 |
| JP | PUB 3230638 | 9/2001 |
| JP | PUB 3239061 | 10/2001 |
| JP | PUB 3507716 | 12/2003 |

OTHER PUBLICATIONS

Kish et al., "Very high-efficiency semiconductor wafer-bonded transparent-substrate (AlxGa1-x)0.5In0.5P/GaP light-emitting diodes", May 23, 1994, American Institute of Physics, Applied Physics Letters 64(21) p. 2839-2841.*

* cited by examiner

*Primary Examiner*—Nathan J. Flynn
*Assistant Examiner*—Scott R. Wilson
(74) *Attorney, Agent, or Firm*—Nixon & Vanderhye, P.C.

(57) ABSTRACT

There is provided and manufactured, at a low cost and with high yields, a semiconductor light emitting device which allows extraction of light produced in an emitter layer not only from its top surface but also from its side surfaces and which has high luminance. An AlGaInP-based semiconductor light emitting device having a contact layer 8 made of $(Al_yGa_{1-y})_zIn_{1-z}P$ ($0 \leq y \leq 1$, $0 < z < 1$) disposed between an emitter layer 3 and a transparent substrate 2 which is transparent to emission wavelengths from the emitter layer 3.

18 Claims, 6 Drawing Sheets

SEMICONDUCTOR LIGHT EMITTING DEVICE AND METHOD FOR MANUFACTURING SAME

BACKGROUND OF THE INVENTION

The present invention relates to a semiconductor light emitting device and a method for manufacturing the same.

In recent years, among semiconductor light emitting devices, Light Emitting Diodes (LEDs) are widely used in optical communications, information display panels, auxiliary light sources for CCD cameras, LCD back lights and the like. It is important for these light emitting diodes to have high luminance. The luminance of the light emitting diodes is dependent on a ratio of the number of passing electrons to the number of photons emitted outside, i.e., external quantum efficiency. The external quantum efficiency is determined by internal quantum efficiency, that is a ratio of passing electrons to photons produced in emitter layers of the light emitting diodes, and by an external emission efficiency, that is a rate of the produced photons which is emitted out of the devices. Among them, the external emission efficiency is largely influenced by device structures.

In the light emitting diodes, it is effective for the purpose of improving the external emission efficiency to use translucent substrates transparent to emission wavelengths. This is because when substrates opaque to emission wavelengths are used, light is emitted only from the upper surface, whereas when the transparent substrates are used, light can be extracted not only from the upper surface but also from the side surfaces. Moreover, light reflected off the lower surface may be emitted from the upper surface and the side surfaces. This method is applied to infrared light emitting diodes using InGaAsP-based semiconductor materials, red and infrared light emitting diodes using AlGaAs-based semiconductor materials, yellow light emitting diodes using GaAsP-based semiconductor materials, green light emitting diodes using GaP-based semiconductor materials and the like.

In the above-stated methods for manufacturing a semiconductor light emitting device, the GaP transparent substrate is directly bonded to an intermediate layer of the emitter layer or the GaP adhesion layer provided on the intermediate layer of the emitter layer. For the direct bonding, it is important to smooth the junction surfaces so that the both surfaces are closely fit to each other. However, as the intermediate layer of the emitter layer is thin, it is not possible to smooth both surfaces by polishing or other techniques if hillocks are generated. Moreover, the GaP adhesion layer is not matched to the emitter layer, and therefore not only its surface fails to be a smooth mirror surface, but also hillocks, which are protruding-type crystal defects, tend to be generated. Once hillocks are generated, it is difficult to obtain a completely smooth surface even if polishing is applied, and therefore direct bonding is not achieved in the vicinity of the hillocks and so voids are generated, causing the yields to be decreased.

Figure 9:
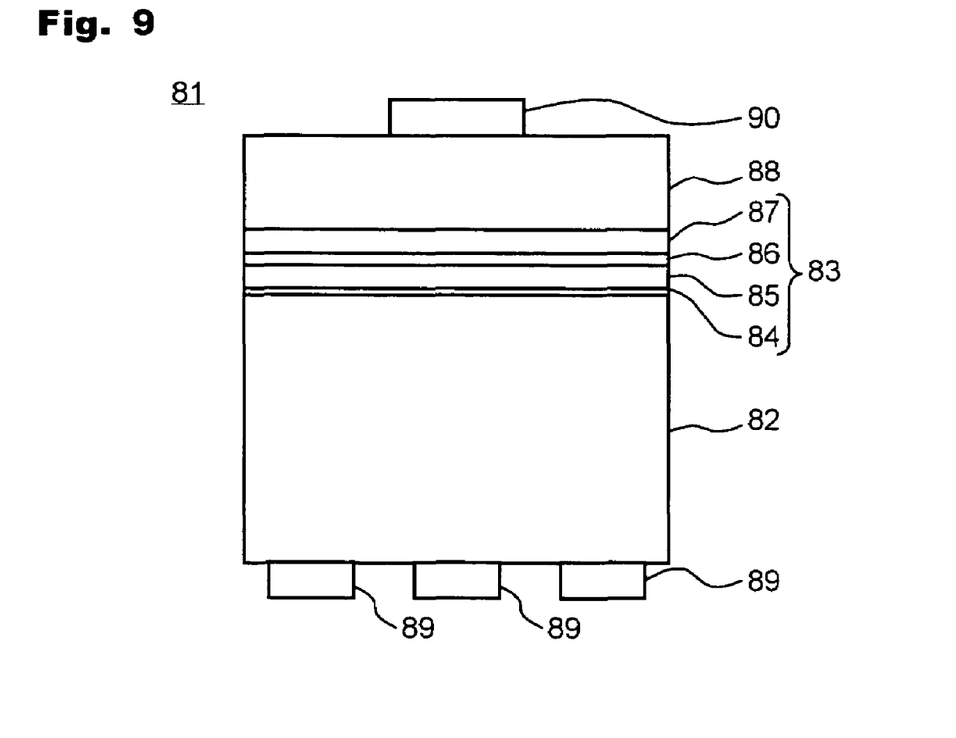
FIG. 9 is a side view showing a conventional semiconductor light emitting device.

The GaP transparent substrate 82 is not matched to the AlGaInP intermediate layer 84, and therefore it is not possible to form the emitter layer 83 on the transparent substrate 82 with good crystallinity by normal layer growth method. Accordingly, several methods for manufacturing semiconductor light emitting devices with use of transparent substrates that are not matched to emitter layers have been proposed and disclosed in the following patent documents.

Patent Document 1: Japanese unexamined patent application No. H06-302857
Patent Document 2: Japanese unexamined patent application No. H06-296040
Patent Document 3: Japanese unexamined patent application No. 2000-196139
Patent Document 4: Japanese unexamined patent application No. 2001-144322

In the Patent Document 1, disclosed is a method for manufacturing a semiconductor light emitting device, composed of the steps of: forming an emitter layer on a GaAs substrate opaque to emission wavelengths by epitaxial growth method; forming a GaP current diffusion layer of several dozen µm on the emitter layer by epitaxial growth method; removing the GaAs substrate opaque to emission wavelengths; placing a GaP transparent substrate on the plane from which the GaAs substrate is removed; and applying heat treatment so as to directly bond the GaP transparent substrate. The thickness of the GaP current diffusion layer formed on the emitter layer is about 50 to 100 µm in view of a growth time and the mechanical strength of the wafer after removal of the GaAs substrate. This is because if the thickness is 50 µm or smaller, the wafer tends to break down when being treated, whereas if the thickness is 100 µm or larger, a growth time becomes longer and the costs of the light emitting diodes become higher.

In the patent document 2, disclosed is a method for manufacturing a semiconductor light emitting device, composed of the steps of: forming an emitter layer on a GaAs substrate opaque to emission wavelengths by epitaxial growth method; placing a GaP transparent substrate transparent to emission wavelengths on the emitter layer and applying heat treatment so as to directly bonding the GaP transparent substrate; and then removing the GaAs substrate opaque to emission wavelengths.

Further, in the patent document 3, disclosed is a method for manufacturing a semiconductor light emitting device, composed of the steps of: forming a p-type semiconductor layer that functions as a current diffusion layer on an undoped or n-type GaAs substrate; forming an emitter layer thereon; forming an n-type GaP adhesion layer thereon; applying heat treatment so as to bond the n-type GaP adhesion layer and an n-type GaP transparent substrate; and then removing the GaAs substrate.

Further, in the patent document 4, disclosed is a method for manufacturing a semiconductor light emitting device, composed of the steps of: forming an n-type GaP adhesion layer by Metal-Organic Chemical Vapor Deposition (MOCVD) method on an emitter layer; and applying heat treatment so as to bond the n-type GaP adhesion layer and an n-type GaP transparent substrate.

In the above-stated methods for manufacturing a semiconductor light emitting device, the GaP transparent substrate is directly bonded to an intermediate layer of the emitter layer or the GaP adhesion layer provided on the intermediate layer of the emitter layer. For the direct bonding, it is important to smooth the junction surfaces so that the both surfaces are closely fit to each other. However, as the intermediate layer of the emitter layer is thin, it is not possible to smooth the both surfaces by polishing or other techniques if hillocks are generated. Moreover, the GaP adhesion layer is not matched to the emitter layer, and therefore not only its surface fails to be a smooth mirror surface, but also hillocks, which are protruding-type crystal defects, tend to be generated. Once hillocks are generated, it is difficult to obtain a completely smooth surface even if polishing is applied, and therefore direct bonding is not achieved in the vicinity of the hillocks and so voids are generated, causing the yields to be decreased.

SUMMARY OF THE INVENTION

Accordingly, an object of the present invention is to manufacture and provide, at a low cost and with high yields, a semiconductor light emitting device which allows extraction of light produced in an emitter layer not only from its top surface but also from its side surfaces and which has high luminance.

More specifically, an object of the present invention is to suppress decrease of yields caused by voids generated when a GaP transparent substrate is directly bonded in manufacturing of a semiconductor light emitting device.

A semiconductor light emitting device according to the present invention is an AlGaInP-based semiconductor light emitting device comprising a contact layer made of $(Al_yGa_{1-y})_zIn_{1-z}P$ ($0 \leq y \leq 1$, $0 < z < 1$) disposed between an emitter layer and a transparent substrate which is transparent to emission wavelengths from the emitter layer.

According to this constitution, the surface of the contact layer can be smoothed, which makes it possible to suppress generation of voids when the transparent substrate is bonded to the contact layer.

Further, in the semiconductor light emitting device the transparent substrate may be GaP.

According to this constitution, the GaP substrate is transparent to wavelengths of green to red colors, which makes it possible to provide green to red semiconductor light emitting devices with high luminance.

Further, in the semiconductor light emitting device the contact layer may be $Ga_zIn_{1-z}P$ ($0.5 < z < 1$).

According to this constitution, the contact layer is less susceptible to oxidization, and therefore quality of the junction surface is preserved even after the junction surface is smoothed by polishing, allowing good junction with the substrate.

Further, in the semiconductor light emitting device the transparent substrate and the contact layer may be joined by direct bonding.

According to this constitution, the transparent substrate can be formed on the emitter layer at a cost lower than that by layer growth method.

Further, in the semiconductor light emitting device a relative proportion of In in the contact layer may be 7% to 12%, preferably 8% to 10%.

According to this constitution, with the relative proportion of In in the contact layer being 7% or more, the contact layer has a protruding-type hillock with a height of 200 nm or lower, whereas with the relative proportion of In being 8% or more, the contact layer becomes a smooth plane almost free from hillocks or has a recessed-type hillock. Therefore, it becomes possible to easily smooth the surface and to prevent bonding failure of the transparent substrate. This makes it possible to improve the yields of the semiconductor light emitting device.

Further, in the semiconductor light emitting device a thickness of the contact layer may be 8 μm or less, preferably 3 μm or less.

According to this constitution, when the height of a hillock on the surface of the contact layer is small, the surface of the contact layer may be smoothed by less polishing. Therefore, errors in manufacturing are diminished, which allows the thickness of the contact layer after polishing to be set smaller. Consequently, decreasing the thickness of the contact layer makes it possible to provide a semiconductor light emitting device with good characteristics at a low cost.

Further, in the semiconductor light emitting device a carrier concentration of the contact layer may be $2 \times 10^{18}$ cm$^{-3}$ or more, preferably $4 \times 10^{18}$ cm$^{-3}$ or more.

According to this constitution, by the tunnel effect, electrons can pass through a barrier caused by the interface state generated in a direct bonding interface, making it possible to provide a semiconductor light emitting device with a low operating voltage.

Further, in the semiconductor light emitting device both the contact layer and the transparent substrate may be p type.

According to the aforementioned constitution, even if a band structure is deformed by the interface state in the direct bonding interface, p-type contact layer and transparent substrate are less apt to be a barrier against the carriers. This allows decrease of voltage drop, making it possible to provide a semiconductor light emitting device with a low operating voltage.

Further, in the semiconductor light emitting device a carrier concentration of the contact layer may be $1 \times 10^{18}$ cm$^{-3}$ or more, preferably $2 \times 10^{18}$ cm$^{-3}$ or more.

According to the aforementioned constitution, the carrier concentration is high and so a slight crystal defect on the junction surface would not cause a barrier to the carriers, making it possible to provide a semiconductor light emitting device with a low operating voltage.

Further, the semiconductor light emitting device may have a transparent electrode formed on the emitter layer, the transparent electrode having high light transmittance at emission wavelengths.

According to this constitution, current diffusion is improved and light emission directly under the bonding pad can be reduced, making it possible to provide a semiconductor light emitting device with high luminance.

A method for manufacturing a semiconductor light emitting device comprises the steps of: forming an AlGaInP-based emitter layer on a growth substrate made of a material matched to AlGaInP, and forming a contact layer made of $(Al_yGa_{1-y})_zIn_{1-z}P$ ($0 \leq y \leq 1$, $0 < z < 1$) on the emitter layer; smoothing a surface of the contact layer; directly bonding a transparent substrate which is transparent to the surface of the contact layer; and removing the growth substrate.

According to this method, the surface of the contact layer can be smoothed and generation of voids can be suppressed even if the transparent substrate which is not matched to the contact layer is bonded thereto.

Further, in the method for manufacturing a semiconductor light emitting device, the growth substrate may be GaAs.

According to this method, it becomes possible to form a $(Al_yGa_{1-y})_zIn_{1-z}P$ ($0 \leq y \leq 1$, $0 < z < 1$) emitter layer which is matched to the GaAs substrate and which has good crystallinity.

Further, in the method for manufacturing a semiconductor light emitting device, the transparent substrate may be GaP.

According to this method, the GaP substrate is transparent to the wavelengths of green to red colors, which makes it possible to manufacture green to red semiconductor light emitting devices with high luminance.

Further, in the method for manufacturing a semiconductor light emitting device, the contact layer may be $Ga_zIn_{1-z}P$ ($0 \leq y \leq 1$, $0.5 < z < 1$).

According to this method, the contact layer is less susceptible to oxidization, and therefore quality of the junction surface is preserved even after the junction surface is smoothed by polishing, allowing efficient bonding to the substrate.

Further, in the method for manufacturing a semiconductor light emitting device, the contact layer may have a relative proportion of In which makes a height of a hillock on the surface of the contact layer 200 nm or less.

According to this method, the surface of the contact layer may be easily smoothed by several μm polishing, and bonding failure of the transparent substrate may be prevented. This makes it possible to improve the yields of the semiconductor light emitting device.

Further, in the method for manufacturing a semiconductor light emitting device, a relative proportion of In in the contact layer may be 7% to 12%, preferably 8% to 10%.

According to this method, with the relative proportion of In in the contact layer being 7% or more, the contact layer has a protruding-type hillock with a height of 200 nm or lower, whereas with the relative proportion of In being 8% or more, the contact layer becomes a smooth plane almost free from hillocks or has a recessed-type hillock. Therefore, it becomes possible to easily smooth the surface and to prevent bonding failure of the transparent substrate. This makes it possible to improve the yields of the semiconductor light emitting device.

Further, in the method for manufacturing a semiconductor light emitting device, a thickness of the contact layer in the forming process may be 10 μm or less, preferably 5 μm or less.

According to this method, decreasing the thickness of the contact layer in the forming process allows reduction of a time and cost for forming the contact layer, thereby making it possible to manufacture a semiconductor light emitting device with good characteristics at a low cost.

Further, in the method for manufacturing a semiconductor light emitting device, a carrier concentration of the contact layer may be $2\times10^{18}$ cm$^{-3}$ or more, preferably $4\times10^{18}$ cm$^{-3}$ or more.

According to this method, by the tunnel effect, elections can pass through a barrier caused by the interface state generated in a direct bonding interface, making it possible to manufacture a semiconductor light emitting device with a low operating voltage.

Further, in the method for manufacturing a semiconductor light emitting device, both the contact layer and the transparent substrate may be p type.

According to this method, even if a band structure is deformed by the interface state in the direct bonding interface, p-type contact layer and transparent substrate are less apt to be a barrier against the carriers. This allows decrease of voltage drop, making it possible to manufacture a semiconductor light emitting device with a low operating voltage.

Further, in the method for manufacturing a semiconductor light emitting device, a carrier concentration of the contact layer may be $1\times10^{18}$ cm$^{-3}$ or more, preferably $2\times10^{18}$ cm$^{-3}$ or more.

According to this method, the carrier concentration is high and so a slight crystal defect on the junction surface would not cause a barrier to the carriers, making it possible to manufacture a semiconductor light emitting device with a low operating voltage.

Further, the method for manufacturing a semiconductor light emitting device may have a step of forming a transparent electrode on the emitter layer, the transparent electrode having high light transmittance at emission wavelengths.

According to this method, current diffusion is improved and light emission directly under the bonding pad can be reduced, making it possible to manufacture a semiconductor light emitting device with high luminance.

As described above, the contact layer which is directly bonded to the transparent substrate transparent to emission wavelengths is composed of $(Al_yGa_{1-y})_zIn_{1-z}P$ ($0 \leq y \leq 1$, $0 < z < 1$) and is structured to contain In, so that the hillock height of the contact layer can be decreased, or the hillock can be formed into a recessed shape. As a result, the surface may be completely smoothed by several μm-thick polishing, which makes it possible to obtain a semiconductor light emitting device with good characteristics without voids and to improve the yields.

BRIEF DESCRIPTION OF THE DRAWINGS

Further objects and advantages of the present invention will become clear from the following description taken in conjunction with the preferred embodiments thereof with reference to the accompanying drawings, in which:

FIG. 6 is a graph view showing the relation between a hillock height and a relative proportion of In;

DETAILED DESCRIPTION OF THE PREFERRED EMBODIMENTS (Embodiment 1)

Figure 1:
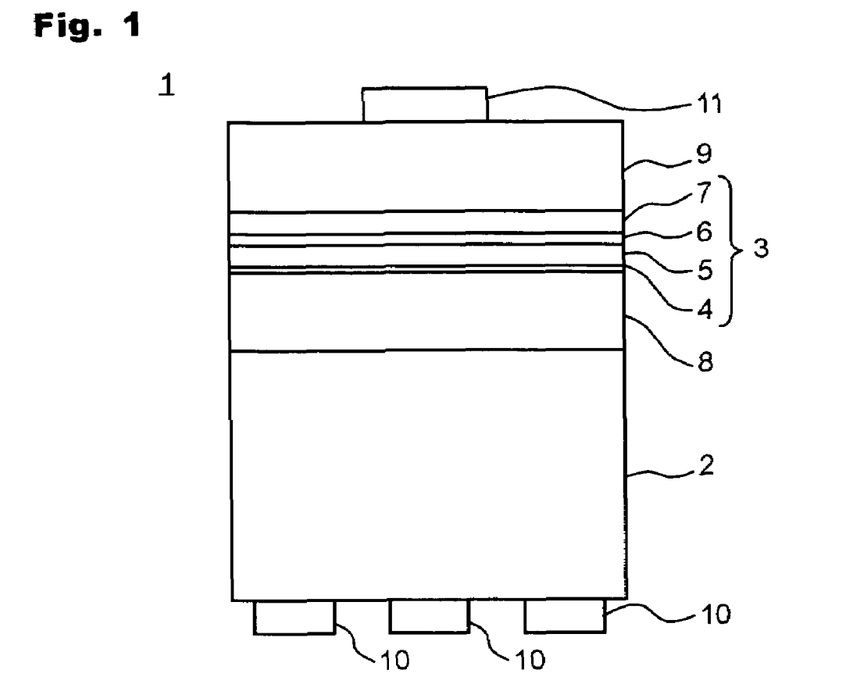
FIG. 1 is a side view showing a semiconductor light emitting device in a first embodiment.

FIG. 1 is a side view showing a Light Emitting Diode (LED) 1, a typical semiconductor light emitting device in an example first embodiment. The light emitting diode 1 has an n-type transparent substrate 2 made of GaP that is transparent to emission wavelengths, and an AlGaInP-based emitter layer 3. The emitter layer 3 has a known structure, which is comprised of an n-type intermediate layer 4 made of $(Al_{0.2}Ga_{0.8})_{0.77}In_{0.23}P$, an n-type first cladding layer 5 made of $Al_{0.5}In_{0.5}P$, an active layer 6 including a barrier layer made of $(Al_{0.6}Ga_{0.4})_{0.5}In_{0.5}P$ and a well layer made of $(Al_{0.2}Ga_{0.8})_{0.5}In_{0.5}P$, and a p-type second cladding layer 7 made of $Al_{0.5}In_{0.5}P$. The light emitting diode 1 has an n-type contact layer 8 made of $(Al_{0.1}Ga_{0.9})_{0.93}In_{0.07}P$ disposed in between the transparent substrate 2 and the emitter layer 3. Moreover, the light emitting diode 1 has a p-type current diffusion layer 9 made of $Al_{0.7}Ga_{0.3}As$ formed on the emitter layer 3, a plurality of n-type electrodes 10 made of AuSi formed under the transparent substrate 2, and a bonding pad (electrode) 11 made of AuZn/Mo/Au formed on the current diffusion layer 9.

Figure 2:
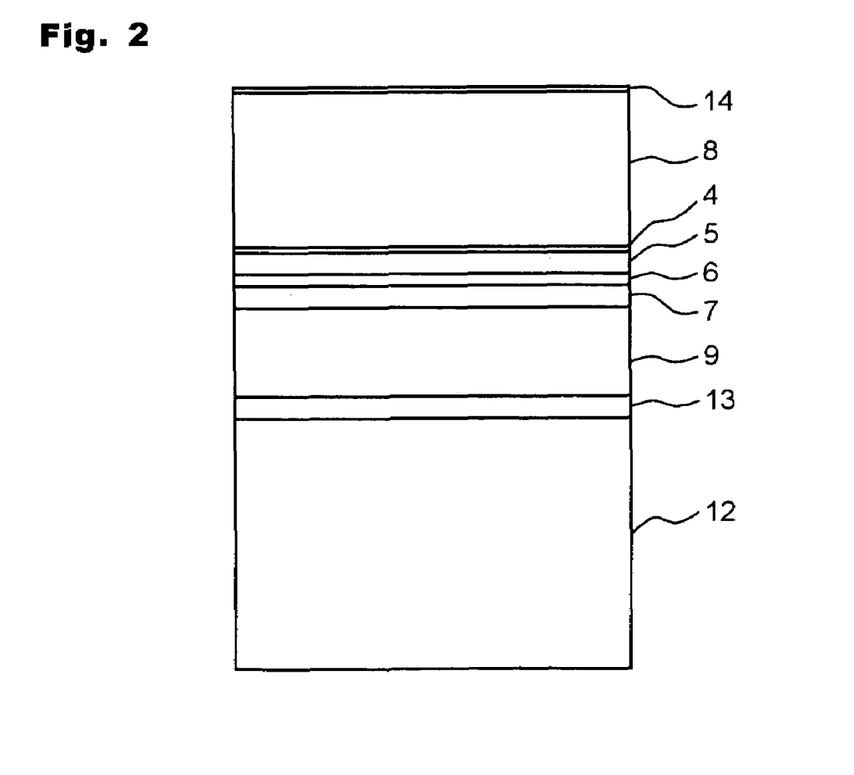
FIG. 2 is a side view showing the steps for manufacturing the semiconductor light emitting device of FIG. 1.

FIGS. 2 to 6 show the steps for manufacturing the light emitting diode 1. First of all, as shown in FIG. 2, a p-type buffer layer 13 made of GaAs with a thickness of 1 μm is formed on an n-type growth substrate 12 made of GaAs matched to AlInP, and a light emitting diode described hereinbelow is formed on the buffer layer 13. Here, Zn is used as P-type dopant while Si is used as n-type dopant. Since FIG. 2 is an upside-down view of FIG. 1, each layer is formed on the buffer layer 13 starting from the p-type current diffusion layer 9 except the bonding pad 11 which is an electrode mounted at last. The p-type second cladding layer 7 with a thickness of 1 μm is formed on the current diffusion layer 9, and on the second cladding layer 7, there are formed the active layer 6, the n-type first cladding layer 5 with a thickness of 1 μm and the n-type intermediate layer 4 with a thickness of 0.15 μm to constitute the emitter layer 3. Then, on the emitter layer 3, the n-type contact layer 8 with a thickness of 10 μm is formed, and further a cap layer 14 with a thickness of 0.01 μm is formed. The aforementioned respective layers are laminated by Metal-Organic Chemical Vapor Deposition (MOCVD) method, though other various methods such as MBE method and MOMBE method are also applicable. Further, in the present embodiment, the relative proportion of In in the contact layer 8 is 7%, and the carrier concentration is $4 \times 10^{18}$ cm$^{-3}$.

Figure 3:
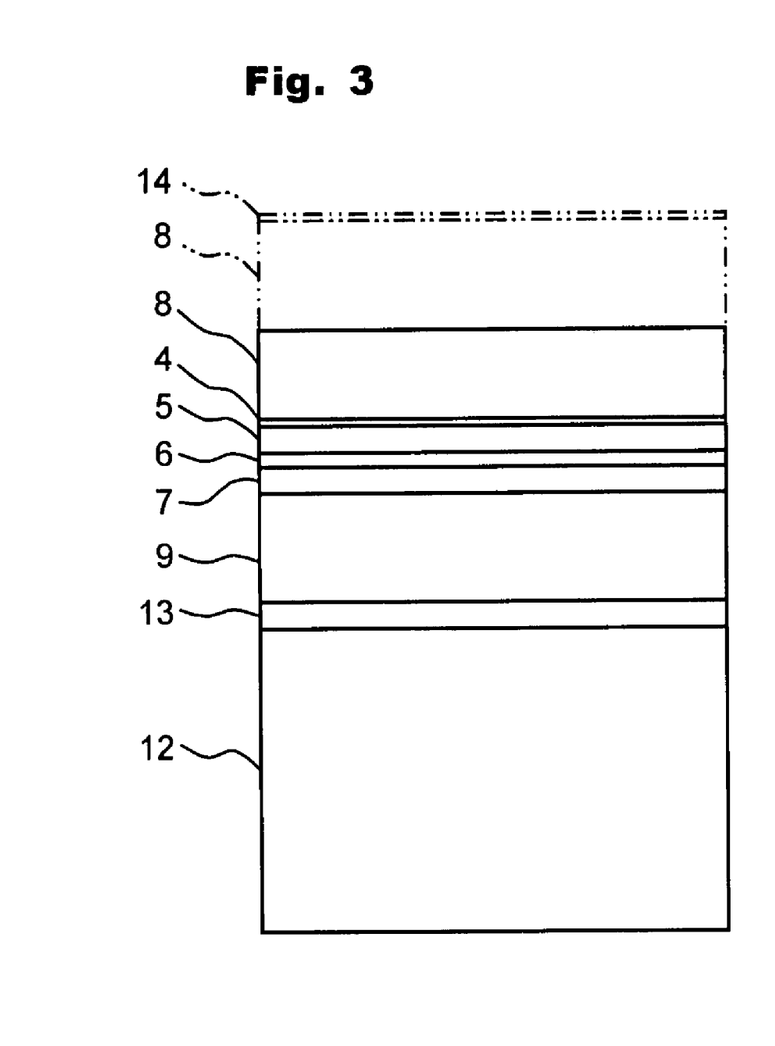
FIG. 3 is a side view showing the steps for manufacturing the semiconductor light emitting device of FIG. 1.

Next, as shown in FIG. 3, the surface of the contact layer 8 is smoothed by polishing the surface of the cap layer 14 by 5 μm, and then treated with an etchant. Moreover, the surface of an n-type transparent substrate 2 made of GaP, which is separately prepared, is also treated with an etchant to remove an oxide. After cleaned and dried, the surface of the transparent substrate 2 which was treated with the etchant is brought into intimate contact with the surface of the contact layer 8, and is heated for 1 hour at 800° C. in vacuum. By this, the contact layer 8 and the transparent substrate 2 are directly bonded as shown in FIG. 4.

Figure 4:
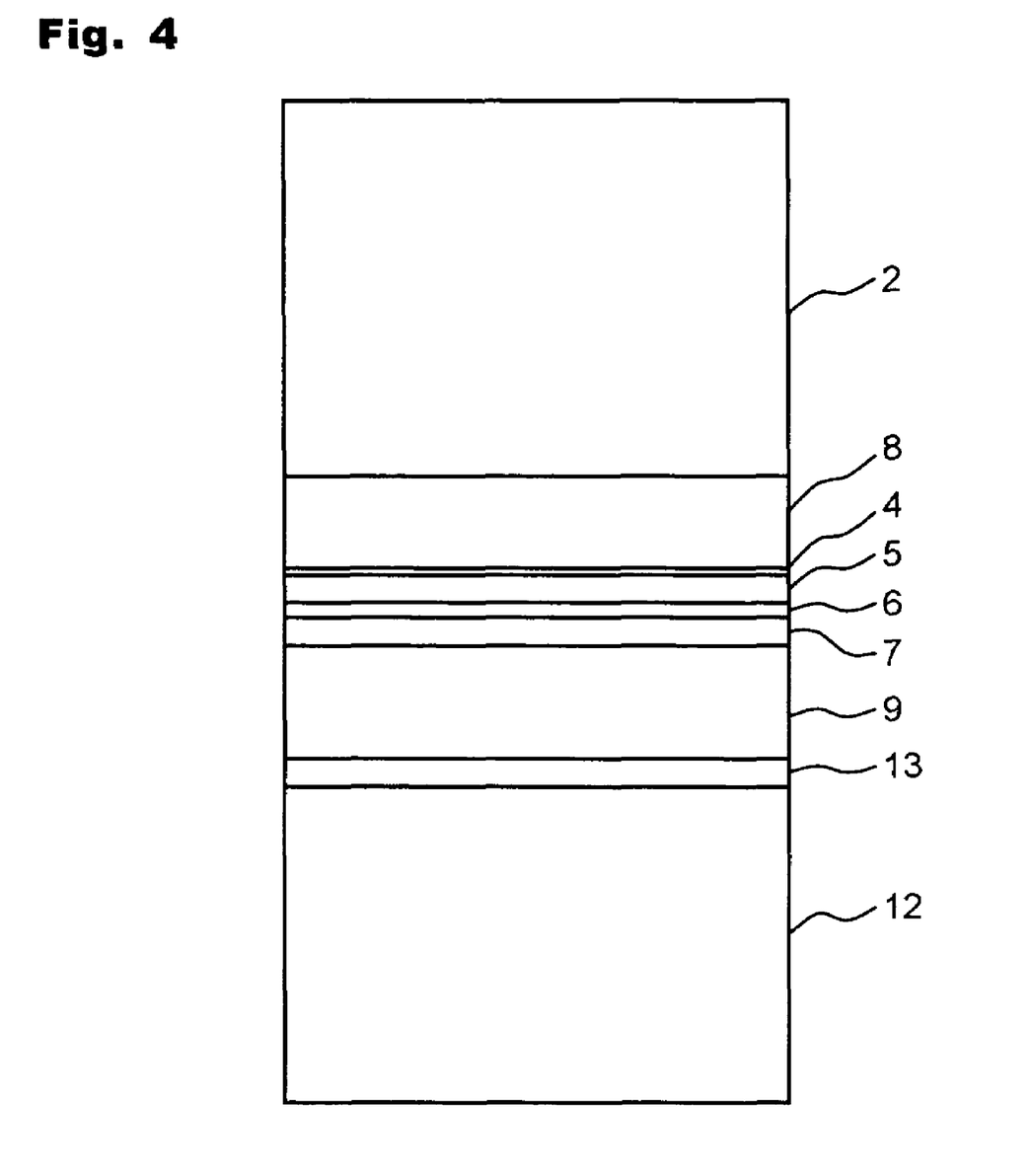
FIG. 4 is a side view showing the steps for manufacturing the semiconductor light emitting device of FIG. 1.
Figure 5:
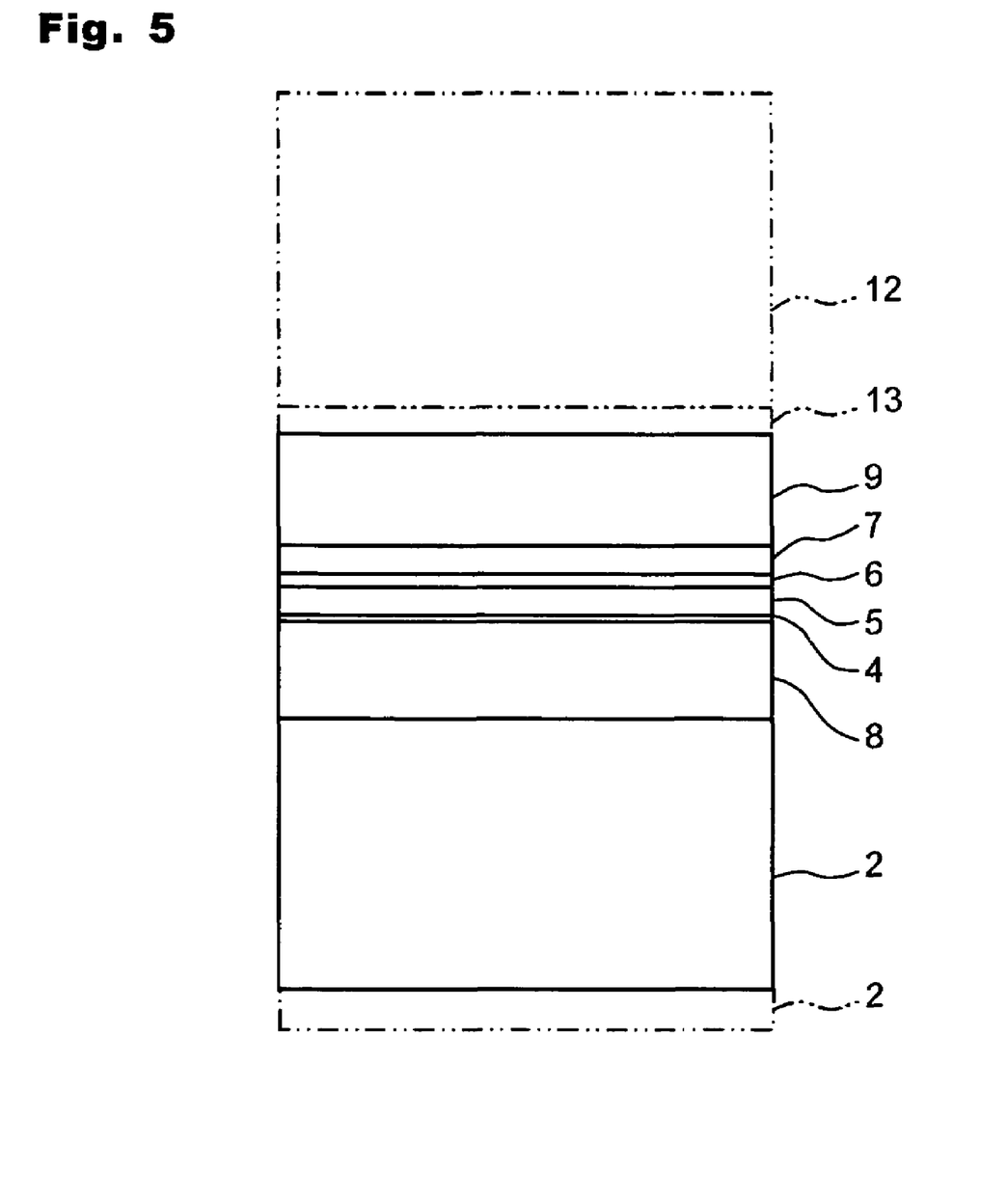
FIG. 5 is a side view showing the steps for manufacturing the semiconductor light emitting device of FIG. 1.

Further, as shown in FIG. 5 which is also an upside-down view of FIGS. 2 to 4, the growth substrate 12 and the buffer layer 13 are removed by etching with use of an etchant of ammonia and hydrogen peroxide solution. Then, the lower surface of the transparent substrate 2 is polished so as to obtain a specified thickness. Further, the electrodes 10 are provided on the lower surface of the transparent substrate, and the bonding pad 11 is provided on the upper surface of the current diffusion layer 9, by which the light emitting diode 1 shown in FIG. 1 is completed.

Figure 6:
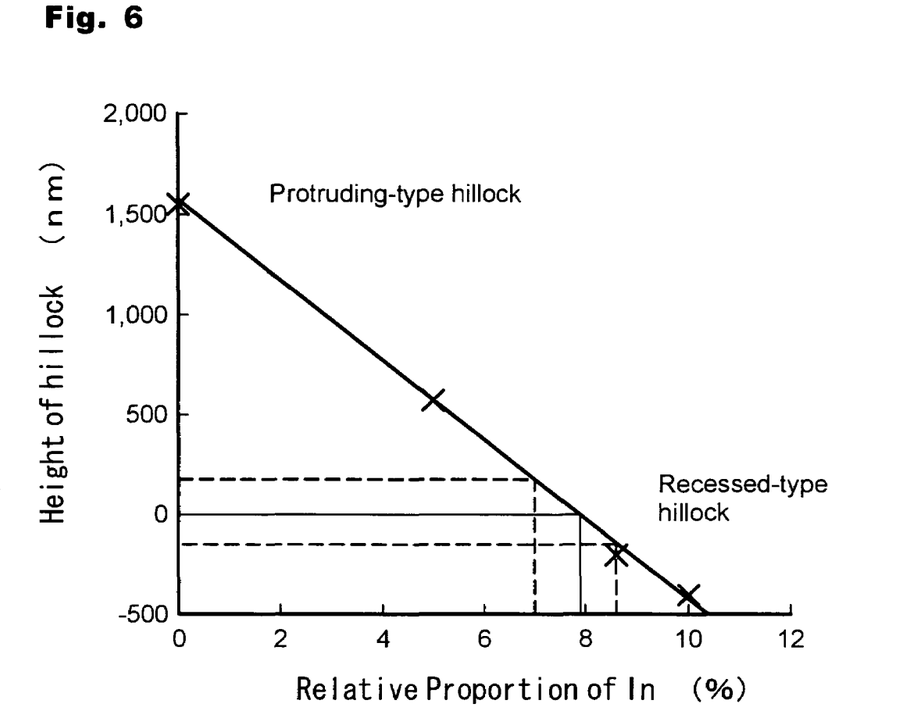

As shown in FIG. 6, the shape of a hillock generated on the surface of the contact layer 8 depends on the relative proportion of In. Without In contained, the hillock becomes a protruding shape, and its height becomes approx. 1.6 μm. If such a hillock emerges, the surface of the contact layer 8 cannot be fully smoothed even if a several μm thickness is polished away. If the transparent substrate 2 is heated and bonded to the contact layer 8 which is not fully smoothed, then voids are naturally produced to decrease the yields, and in the worst case, only the protruding portion of the hillock may be bonded to the transparent substrate 2 so that most part of the transparent substrate 2 is left without bonding.

The contact layer 8 of the light emitting diode 1 is made of $(Al_{0.1}Ga_{0.9})_{0.93}In_{0.07}P$, and contains 7% In. In this case, the hillock of the contact layer 8 is a protruding type with a height of approx. 200 nm, and the surface of the contact layer 8 can be sufficiently smoothed by polishing the contact layer 8 by approx. 5 μm. Consequently, the yields when the transparent substrate 2 is heat-bonded to the transparent substrate 2 is significantly improved. Further, since the contact layer 8 does not need deep polishing, changes in conditions and errors in manufacturing are decreased. This makes it possible to set the thickness of the contact layer 8 to be left after polishing at 8 μm or less (5 μm in the present embodiment). Consequently, the thickness of the contact layer 8 in the forming process may be as thin as 10 μm as described in the present embodiment. Thus, the decreased height of the hillock contributes to reduction of manufacturing costs required in forming and smoothing the contact layer 8.

Moreover, as the relative proportion of In in the contact layer 8 increases, the height of the hillock becomes almost 0 when In is about 8%, and as the relative proportion of In further increases, the hillock is formed into a recessed shape and a difference in coefficient of thermal expansion between the contact layer 8 and the growth substrate 12 becomes large. If the relative proportion of In exceeds 12%, a wafer composed of respective layers including the growth substrate 12 and the contact layer 8 gains a warp when it is cooled after MOCVD growth due to this coefficient of thermal expansion. The warp is undesired as it causes breakage of the wafer in a later polishing step. Preferably, if relative proportion of In is set at 10% or less, such a warp becomes smaller to the negligible level.

In the light emitting diode 1, the external quantum efficiency at 20 mA was 5.5%. In a light emitting diode composed of an emitter layer, a DBR, a current diffusion layer and electrodes having the same structures as the light emitting diode 1 formed on a GaAs substrate that is not transparent to emission wavelengths, the external quantum efficiency is as low as about 2.3%. This difference is contributed by the transparent substrate 2.

Further, the operating voltage at 20 mA was 2.3V. This is because the carrier concentration of the n-type contact layer 8 is as sufficiently high as $4 \times 10^{18}$ cm$^{-3}$. Normally, the interface state is generated in a bonding interface between the n-type contact layer 8 and the n-type GaP transparent substrate 2, and the interface state deforms the band structure so that it becomes a barrier to electrons. If the carrier concentration of the n-type contact layer 8 made of $(Al_{0.1}Ga_{0.9})_{0.93}In_{0.07}P$ is higher than $2 \times 10^{18}$ cm$^{-3}$, then electrons can pass through the barrier by the tunnel effect and therefore rise of the operating voltage can be suppressed. The operating voltage in the case where the carrier concentration is $2 \times 10^{18}$ cm$^{-3}$ is 2.5V, and when the carrier concentration is lower than $2 \times 10^{18}$ cm$^{-3}$, rise of the operating voltage due to the barrier becomes remarkable.

In the embodiment 1, the bonding pad 11 is directly formed on the current diffusion layer 9 of $Al_{0.7}Ga_{0.3}As$, though an another electrode contact layer may be inserted between the bonding pad 11 and the current diffusion layer 9 of $Al_{0.7}Ga_{0.3}As$ in order to make it easier to form ohmic contacts.

(Embodiment 2)

Figure 7:
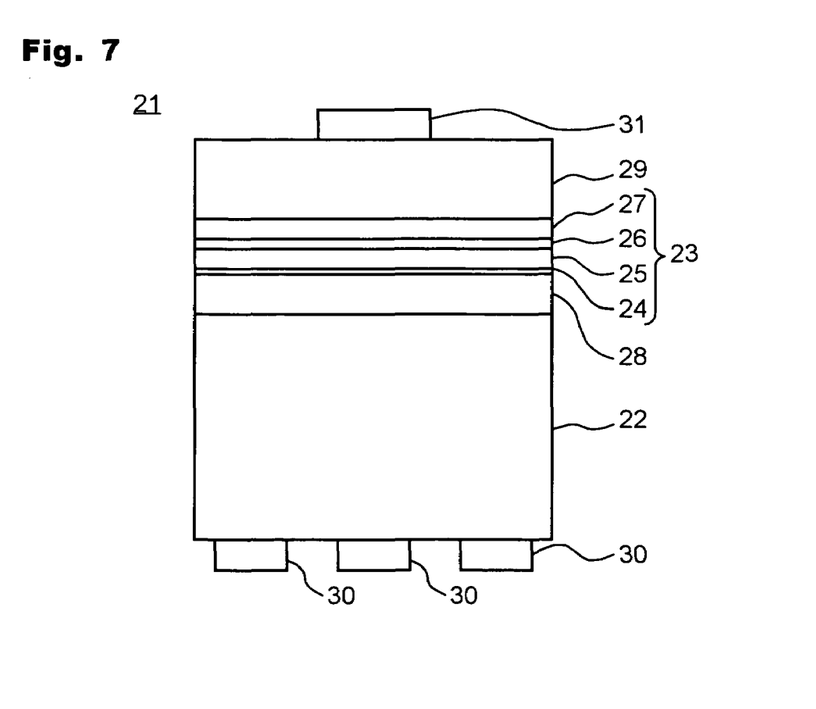
FIG. 7 is a side view showing a semiconductor light emitting device in a second embodiment.

FIG. 7 shows a light emitting diode 21 in the second embodiment. The light emitting diode 21 has a p-type transparent substrate 22 made of GaP that is transparent to emission wavelengths, and an AlGaInP-based emitter layer 23. The emitter layer 23 is composed of a p-type intermediate layer 24 made of $(Al_{0.2}Ga_{0.8})_{0.77}In_{0.23}P$, a p-type first cladding layer 25 made of $Al_{0.5}In_{0.5}P$, an active layer 26 including a barrier layer made of $(Al_{0.5}Ga_{0.5})_{0.5}In_{0.5}P$ and a well layer made of $Ga_{0.5}In_{0.5}P$, and an n-type second cladding layer 27 made of $Al_{0.5}In_{0.5}P$. The light emitting diode 21 has a p-type contact layer 28 made of $(Al_{0.1}Ga_{0.9})_{0.915}In_{0.085}P$ disposed in between the transparent substrate 22 and the emitter layer 23. Moreover, the light emitting diode 21 has an n-type current diffusion layer 29 made of $Al_{0.5}Ga_{0.5}As$ formed on the emitter layer 23, a plurality of p-type electrodes 30 made of AuBe formed into a round shape with a diameter of 40 μm under the transparent substrate 22, and a bonding pad (electrode) 31 made of AuSi/Mo/Au formed on the current diffusion layer 29. The light emitting diode 21 is different from the above-described first embodiment in that p and n types are switched (materials of the electrodes are also different accordingly), and the contact layer 28 is structured such that the relative proportion of In is as slightly high as 8.5%, the carrier concentration is as low as $2 \times 10^{18}$ cm$^{-3}$, and the thickness is small.

The manufacturing steps of the light emitting diode 21 are almost identical to the manufacturing steps of the above-described light emitting diode 1. However, the thickness of the contact layer 28 when formed on the wafer (before polishing) is 5 μm which is half the thickness of the light emitting diode 1, and a thickness which is polished away in the step of smoothing the surface of the contact layer 28 before being bonded to the transparent substrate 22 is as sufficiently small as approx. 2.5 μm.

In the present embodiment, the relative proportion of In in the contact layer 28 is set at 8.5%, and so a hillock to be generated is a recessed type with a depth of approx. 200 nm. In the smoothing operation by polishing, it is not possible to polish away only minute protruding portions. Consequently, if the hillock is a protruding type, the entire contact layer 28 is polished so as to obtain a smooth plane, whereas if the hillock is a recessed type, the recessed portion of the hillock is hardly polished away when the entire contact layer 28 is polished. In the case where the hillock is a recessed type, less polishing is required for the smoothing step. In the present embodiment, therefore, polishing by 2.5 μm is good enough. Since the thickness to be polished away is small, the final thickness of the contact layer 28 in consideration of manufacturing errors and change in conditions can be set at as small as 3 μm or less. Because of this, the contact layer 28 of the light emitting diode 21 may be formed to be as thin as 5 μm or less in the first place. This indicates that the contact layer 28 should preferably be structured such that the relative proportion of In is 8% or more so that the height of a hillock becomes almost 0or is formed into a recessed shape. This obviously contributes to improvement of the yields and reduction of costs.

The operating voltage of the light emitting diode 21 at 20 mA was 2.1V. This is because the contact layer 28 and the transparent substrate 22 are p type, and therefore even if the band structure is deformed by the interface state, a bonding interface is less apt to become a barrier against the carriers. Consequently, even if the carrier concentration is lower than that in the case of n type, carriers can pass through the bonding interface, and the operating voltage significantly rises only when the carrier concentration becomes less than $1 \times 10^{18}$ cm$^{-3}$. In this embodiment, the carrier concentration is as sufficiently high as $2 \times 10^{18}$ cm$^{-3}$, which allows achievement of such a low operating voltage.

Moreover, in the light emitting diode 21, the external quantum efficiency at 20 mA was 15%. In a light emitting diode composed of an emitter layer, a DBR, a current diffusion layer and electrodes having the same structures formed on a p-type GaAs substrate, the external quantum efficiency is as low as about 7.8%.

In the embodiment 2, the bonding pad 31 is directly formed on the current diffusion layer 29 of $Al_{0.5}Ga_{0.5}As$, though an another electrode contact layer may be inserted between the bonding pad 31 and the diffusion layer 29 of $Al_{0.5}Ga_{0.5}As$ in order to make it easier to form ohmic contacts.

(Embodiment 3)

Figure 8:
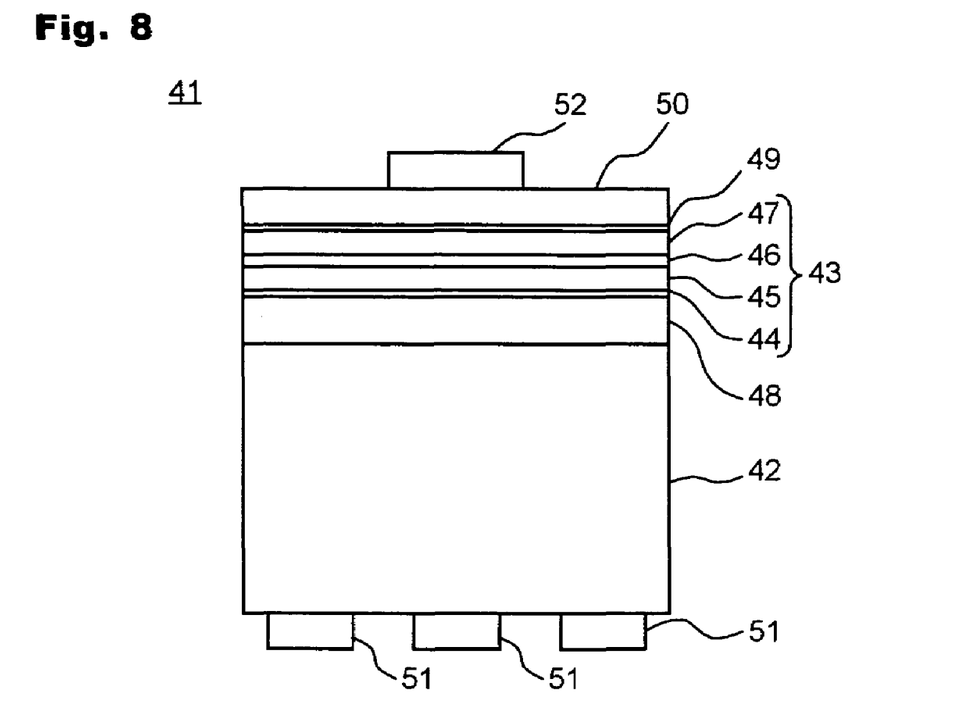
FIG. 8 is a side view showing a semiconductor light emitting device in a third embodiment.

FIG. 8 shows a light emitting diode 41 in the third embodiment. The light emitting diode 41 has a p-type transparent substrate 42 made of GaP that is transparent to emission wavelengths, and an AlGaInP-based emitter layer 43. The emitter layer 43 is composed of a p-type intermediate layer 44 made of $(Al_{0.2}Ga_{0.8})_{0.77}In_{0.23}P$, a p-type first cladding layer 45 made of $Al_{0.5}In_{0.5}P$, an active layer 46 including a barrier layer made of $(Al_{0.5}Ga_{0.5})_{0.5}In_{0.5}P$ and a well layer made of $Ga_{0.5}In_{0.5}P$, and an n-type second cladding layer 47 made of $Al_{0.5}In_{0.5}P$. The light emitting diode 41 has a p-type contact layer 48 made of $Ga_{0.915}In_{0.085}P$ with a carrier concentration of $1 \times 10^{18}$ cm$^{-3}$, which is disposed in between the transparent substrate 42 and the emitter layer 43. Moreover, the light emitting diode 41 has an n-type electrode junction layer 49 made of $(Al_{0.15}Ga_{0.85})_{0.5}In_{0.5}P$ formed on the emitter layer 43, and a transparent electrode 50 made of zinc oxide (GaZnO) containing gallium. Further, a plurality of electrodes 51 are provided under the transparent substrate 42, and a bonding pad is provided on the transparent electrode 50.

In the light emitting diode, the external quantum efficiency at 20 mA was 17%, which is approx. 10% higher than that of the light emitting diode 21 in the above-stated second embodiment. GaZnO constituting the transparent electrode 50 has about 90% light transmittance at emission wavelengths and therefore is not totally transparent, though its current diffusion is better than that of the current diffusion layer made of AlGaAs. Therefore, the proportion of emission immediately under the bonding pad 52 can be reduced to suppress reflection or absorption of light by the bonding pad 52. As a result, the external quantum efficiency is improved. Further, the semiconductor light emitting device does not contain As, and therefore inflicts a smaller impact on the environment.

As described above, a contact layer provided in between the emitter layer and the transparent substrate makes it possible to provide a semiconductor light emitting device with good yields and high luminance at a low cost.

Although the present invention has been fully described by way of the examples with reference to the accompanying drawing, it is to be noted that various changes and modifications will be apparent to those skilled in the art. Therefore, unless such changes and modifications otherwise depart from the spirit and scope of the present invention, they should be construed as being included therein.

What is claimed is:

1. An AlGaInP-based semiconductor light emitting device comprising a contact layer made of $(Al_yGa_{1-y})_zIn_{1-z}P$ ($0 \leq y \leq 1$, $0 < z < 1$) disposed between an emitter layer and a transparent substrate which is transparent to emission wavelengths from the emitter layer, wherein a relative proportion of In in the contact layer is 7% to 12%, preferably 8% to 10%.

2. The semiconductor light emitting device as defined in claim 1, wherein the transparent substrate is GaP.

3. The semiconductor light emitting device as defined in claim 1, wherein the contact layer is $Ga_zIn_{1-z}P$ ($0.5 < z < 1$).

4. The semiconductor light emitting device as defined in claim 1, wherein the transparent substrate and the contact layer are joined by direct bonding.

5. The semiconductor light emitting device as defined in claim 1, wherein a thickness of the contact layer is 8 μm or less, preferably 3 μm or less.

6. The semiconductor light emitting device as defined in claim 1, further comprising a transparent electrode formed on the emitter layer, the transparent electrode having high light transmittance at emission wavelengths.

7. An AlGaInP-base semiconductor light emitting device comprising a contact layer made of $(Al_yGa_{1-y})_zIn_{1-z}P$ ($0 \leq y \leq 1$, $0<z<1$) disposed between an emitter layer and a transparent substrate which is transparent to emission wavelengths from the emitter layer, wherein a carrier concentration of the contact layer is $2 \times 10^{18}$ cm$^{-3}$ or more, preferably $4 \times 10^{18}$ cm$^{-3}$ or more.

8. The semiconductor light emitting device as defined in claim 7, wherein the transparent substrate is GaP.

9. The semiconductor light emitting device as defined in claim 7, wherein the contact layer is $Ga_zIn_{1-z}P$ ($0.5<z<1$).

10. The semiconductor light emitting device as defined in claim 7, wherein the transparent substrate and the contact layer are joined by direct bonding.

11. The semiconductor light emitting device as defined in claim 7, wherein a thickness of the contact layer is 8 μm or less, preferably 3 μm or less.

12. The semiconductor light emitting device as defined in claim 7, further comprising a transparent electrode formed on the emitter layer, the transparent electrode having high light transmittance at emission wavelengths.

13. An AlGaInP-base semiconductor light emitting device comprising a contact layer made of $(Al_yGa_{1-y})_zIn_{1-z}P$ ($0 \leq y \leq 1$, $0<z<1$) disposed between an emitter layer and a transparent substrate which is transparent to emission wavelengths from the emitter layer wherein both the contact layer and the transparent substrate are p type, and wherein a carrier concentration of the contact layer is $1 \times 10^{18}$ cm$^{-3}$ or more, preferably $2 \times 10^{18}$ cm$^{-3}$ or more.

14. The semiconductor light emitting device as defined in claim 13, wherein the transparent substrate is GaP.

15. The semiconductor light emitting device as defined in claim 13, wherein the contact layer is $Ga_zIn_{1-z}P$ ($0.5<z<1$).

16. The semiconductor light emitting device as defined in claim 13, wherein the transparent substrate and the contact layer are joined by direct bonding.

17. The semiconductor light emitting device as defined in claim 13, wherein a thickness of the contact layer is 8 μm or less, preferably 3 μm or less.

18. The semiconductor light emitting device as defined in claim 13, further comprising a transparent electrode formed on the emitter layer, the transparent electrode having high light transmittance at emission wavelengths.

* * * * *